United States Patent
Arai et al.

(10) Patent No.: US 9,008,231 B2
(45) Date of Patent: Apr. 14, 2015

(54) SIGNAL DUTY CYCLE REDUCTION

(71) Applicant: Intel IP Corporation, Santa Clara, CA (US)

(72) Inventors: Tomoyuki Arai, Tempe, AZ (US); Patrick Rakers, Scottsdale, AZ (US)

(73) Assignee: Intel IP Corporation, Santa Clara, CA (US)

( * ) Notice: Subject to any disclaimer, the term of this patent is extended or adjusted under 35 U.S.C. 154(b) by 140 days.

(21) Appl. No.: 13/907,796

(22) Filed: May 31, 2013

(65) Prior Publication Data

US 2014/0355701 A1   Dec. 4, 2014

(51) Int. Cl.
*H03D 3/00* (2006.01)
*H04L 27/14* (2006.01)

(52) U.S. Cl.
CPC .................... *H04L 27/14* (2013.01)

(58) Field of Classification Search
USPC .......... 375/316, 322; 455/130, 205, 208, 209, 455/230, 255; 327/100, 172, 175, 176
See application file for complete search history.

(56) References Cited

U.S. PATENT DOCUMENTS

| | | | |
|---|---|---|---|
| 7,612,595 B2 | 11/2009 | Yang et al. | |
| 7,742,545 B2 | 6/2010 | Salvi et al. | |
| 8,145,155 B2 | 3/2012 | Pullela et al. | |
| 8,712,357 B2 * | 4/2014 | Panikkath et al. | 455/208 |
| 2012/0252393 A1 | 10/2012 | Xie et al. | |
| 2012/0286891 A1 | 11/2012 | Schimper et al. | |

OTHER PUBLICATIONS

D. Kaczman et al, A SingleChip 10-Band WCDMA/HSDPA 4-Band GSM/EDGE SAW-less CMOS Receiver With DigRF 3G Interface and +90 dBm IIP2 IEEE J. Solid-State Circuits, vol. 44, No. 3, pp. 718-739, Mar. 2009.

H. Khatri et al, "A SAW-less CDMA receiver front-end with single-ended LNA and single-balanced mixer with 25% duty-cycle LO in 65nm CMOS", RMO1A-2, May 2009., RFIC2009 (no disclosure of the quad gen topology).

M. Ingels et al, "A 5mm2 40nm LP CMOS 0.1-to-3GHz multistandard transceiver", Feb. 7-11, 2010, ISSCC2010. (no disclosure of the.

A Mirzaei et al, "Analysis and Optimization of Direct-Conversion Receivers With 25% Duty-Cycle Current-Driven Passive Mixers", IEEE J. Solid-State Circuits, vol. 57, No. 9, pp. 2353-2366, Sep. 2010. (K2 type quad gen).

* cited by examiner

*Primary Examiner* — Vineeta Panwalkar
(74) *Attorney, Agent, or Firm* — Baker Botts L.L.P.

(57) ABSTRACT

A method may include receiving a positive in-phase ("I")-channel signal ("I+ signal"), a negative I-channel signal ("I- signal"), a positive quadrature-phase ("Q")-channel signal ("Q+ signal"), and a negative Q-channel signal ("Q- signal"). The method may further include outputting a truncated I+ signal, a truncated I- signal, a truncated Q+ signal, and a truncated Q- signal. The method may further include generating the truncated I+ signal based on the I+ and Q+ signals and a complement of the truncated Q- signal, generating the truncated I- signal based on the I- and Q- signals and a complement of the truncated Q+ signal, generating the truncated Q+ signal based on the I- and Q+ signals and a complement of the truncated I+ signal, and generating the truncated Q- signal based on the I+ and Q- signals and a complement of the truncated I- signal.

20 Claims, 8 Drawing Sheets

SIGNAL DUTY CYCLE REDUCTION

FIELD

The embodiments discussed herein are related to reducing a duty cycle of quadrature-based signals.

BACKGROUND

Wireless communications systems are used in a variety of telecommunications systems, television, radio and other media systems, data communication networks, and other systems to convey information between remote points using wireless transmitters and wireless receivers. In certain instances, a wireless trans wireless receiver may be combined into a single device called a wireless transceiver. In some instances, performance of a wireless receiver (e.g., a noise figure and gain associated with the receiver) may be at least partially based on a duty cycle of signals used to demodulate wireless signals that may be received by the wireless receiver. For example, in some instances a duty cycle of greater than 25% may degrade performance of some wireless receivers.

The subject matter claimed herein is not limited to embodiments that solve any disadvantages or that operate only in environments such as those described above. Rather, this background is only provided to illustrate one example technology area where some embodiments described herein may be practiced.

SUMMARY

According to at least one embodiment described herein a method of reducing a duty cycle of one or more signals may include receiving a positive in-phase ("I")-channel signal ("I+ signal"), a negative I-channel signal ("I− signal"), a positive quadrature-phase ("Q")-channel signal ("Q+ signal"), and a negative Q-channel signal ("Q− signal"). The method may further include outputting a positive truncated I-channel signal ("truncated I+ signal"), a negative truncated I-channel signal ("truncated I− signal"), a positive truncated Q-channel signal ("truncated Q+ signal"), and a negative truncated Q-channel signal ("truncated Q− signal"). The truncated I+ signal may have a reduced duty cycle with respect to the I+ signal, the truncated I− signal may have a reduced duty cycle with respect to the I− signal, the truncated Q+ signal may have a reduced duty cycle with respect to the Q+ signal, and the truncated Q− signal may have a reduced duty cycle with respect to the Q− signal. The method may further include generating the truncated I+ signal based on the I+ signal, the Q+ signal, and a complement of the truncated Q− signal. Additionally, the method may include generating the truncated I− signal based on the I− signal, the Q− signal, and a complement of the truncated Q+ signal. Also, the method may include generating the truncated Q+ signal based on the I− signal, the Q+ signal, and a complement of the truncated I+ signal. In addition, the method may include generating the truncated Q− signal based on the I+ signal, the Q− signal, and a complement of the truncated I− signal.

The object and advantages of the embodiments will be realized and achieved at least by the elements, features, and combinations particularly pointed out in the claims.

It is to be understood that both the foregoing general description and the following detailed description are exemplary and explanatory and are not restrictive of the present disclosure, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Figure 1:
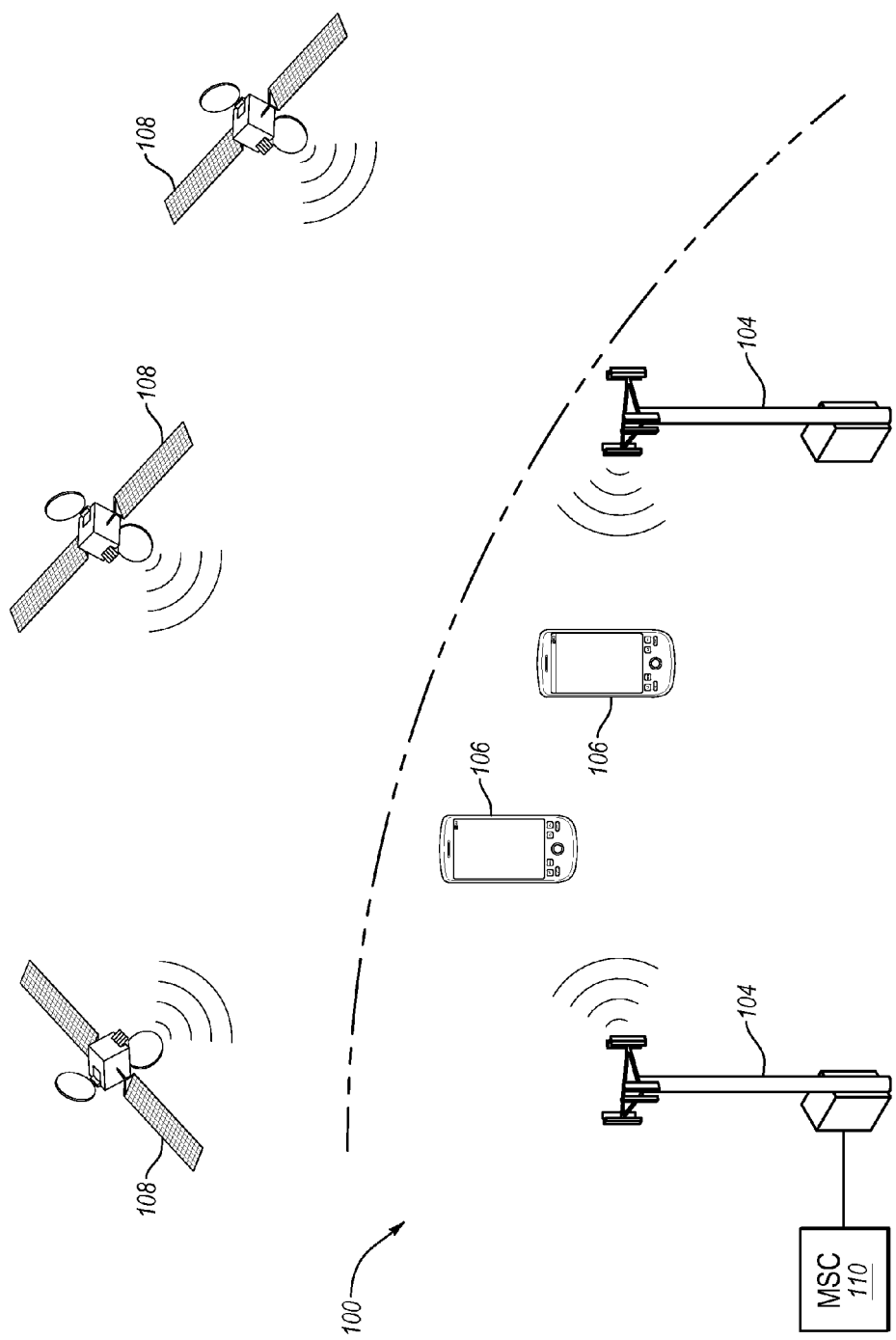
FIG. 1 illustrates an example wireless communication system.

According to some embodiments of the present disclosure, a circuit may be configured to reduce duty cycles of quadrature-phase signals. Signals with substantially the same frequency but that have a phase difference that is approximately one-fourth of their period (i.e., a phase difference of 90 degrees) may be referred to herein as "quadrature-phase," "quadrature-type," quadrature-based," or "quadrature signals." In many applications, a quadrature signal may be referred to as an in-phase (I) signal and a corresponding quadrature signal with the 90-degree phase offset may be referred to as a quadrature-phase (Q) signal.

In some signal processing, quadrature signals may be used to communicate information. For example, in some embodiments, information may be conveyed using an I-channel that includes an I-channel signal and a Q-channel that includes a Q-channel signal. The I-channel and Q-channel signals may have substantially the same frequency but may have a phase difference of approximately 90 degrees. Additionally, the I-channel and Q-channel signals may include I-channel and Q-channel information, respectively, and may be combined and modulated using any suitable quadrature-based modulation scheme, such as Quadrature Amplitude Modulation (QAM), Quadrature Phase Shift Keying (QPSK), or the like.

In some embodiments, demodulation of the signals modulated with a quadrature-based modulation scheme may be performed by using a positive I-channel signal (referred to hereinafter as an "I+ signal"), a negative I-channel signal (referred to hereinafter as an "I− signal") a positive Q-channel signal (referred to hereinafter as a "Q+ signal"), and a negative Q-channel signal (referred to hereinafter as a "Q− signal"), which are explained in further detail below. Additionally, in some embodiments, the demodulation may be improved when the duty cycles of the I+ signal, the I− signal, the Q+ signal, and the Q− signal are reduced.

A duty cycle of a signal may refer to the percentage of time that the signal is asserted "HIGH" with respect to the amount of time that the signal is asserted "LOW." For example, a signal having a 25% duty may be asserted "HIGH" 25% of the time.

According to some embodiments of the present disclosure, a circuit may include one or more inputs configured to receive an I+ signal, an I− signal, a Q+ signal, and a Q+ signal. The circuit may be configured to reduce the duty cycles of the I+ signal, the I− signal, the Q+ signal, and the Q− signal to generate a truncated I+ signal, a truncated I− signal, a truncated Q+ signal, and a truncated Q− signal, which may be output at one or more outputs of the circuit.

As explained in further detail below, in some embodiments, the circuit may include a first logic gate configured to perform an AND operation with respect to the I+ signal, the Q+ signal, and a complement of the truncated Q− signal in association with generation of the truncated I+ signal. The circuit may also include a second logic gate configured to perform the AND operation with respect to the I− signal, the Q− signal, and a complement of the truncated Q+ signal in association with generation of the truncated I− signal. Further, the circuit may include a third logic gate configured to perform the AND operation with respect to the I− signal, the Q+ signal, and a complement of the truncated I+ signal in association with generation of the truncated Q+ signal. Additionally, in some embodiments, the circuit may include a fourth logic gate configured to perform the AND operation with respect to the I+ signal, the Q− signal, and a complement of the truncated I− signal in association with generation of the truncated Q− signal.

In some embodiments, the circuit may be included in an oscillator circuit and may be configured to generate the truncated I+ signal, the truncated I− signal, the truncated Q+ signal, and the truncated Q− signal for demodulation of signals modulated with a quadrature-based modulation scheme. However, generation of the truncated I+ signal, the truncated I− signal, the truncated Q+ signal, and the truncated Q− signal as described herein is not limited to signal demodulation and may be used in any suitable application where a reduced duty cycle of a signal may be desired. Additionally, in some embodiments, the circuit may be implemented with respect to one or more components of a wireless communication system, but is not limited to wireless communication system applications.

Embodiments of the present disclosure will be explained with reference to the accompanying drawings.

FIG. 1 illustrates an example wireless communication system 100 (referred to hereinafter as "system 100"), arranged in accordance with at least one embodiment described herein. The system 100 may be configured to provide wireless communication services to one or more terminals 106 via one or more access points 104. Although not expressly illustrated in FIG. 1, the system 100 may include any number of access points 104 providing wireless communication services to any number of terminals 106. Additionally, with respect to the use of substantially any plural and/or singular terms herein, those having skill in the art can translate from the plural to the singular and/or from the singular to the plural as is appropriate to the context and/or application.

The wireless communication services provided by the system 100 may include voice services, data services, messaging services, and/or any suitable combination thereof. The system 100 may include a Frequency Division Duplexing (FDD) network, a Frequency Division Multiple Access (FDMA) network, an Orthogonal FDMA (OFDMA) network, a Code Division Multiple Access (CDMA) network, a Time Division Multiple Access (TDMA) network, a Direct Sequence Spread Spectrum (DSSS) network, a Frequency Hopping Spread Spectrum (FHSS) network, and/or some other wireless communication network. In some embodiments, the system 100 may be configured to operate as a second generation (2G) wireless communication network, a third generation (3G) wireless communication network, a fourth generation (4G) wireless communication network, and/or a Wi-Fi network. In these or other embodiments, the system 100 may be configured to operate as a Long Term Evolution (LTE) wireless communication network.

The access points 104 may be any suitable wireless network communication point that may provide wireless communication services to a terminal 106. The access points 104 may include, by way of example but not limitation, a base station, a remote radio head (RRH), a Node B, an evolved Node B (eNB), or any other suitable communication point. In some embodiments, a mobile switching center (MSC) 110 may be communicatively coupled to the access points 104 and may provide coordination and control for the access points 104.

The terminals 106 may be any device that may use the system 100 for obtaining wireless communication services and may also be referred to as a remote station, a mobile station, an access terminal, user equipment (UE), a wireless communication device, a cellular phone, or some other terminology. For example, a terminal 106 may include, by way of example and not limitation, a cellular phone, a smartphone, a personal data assistant (PDA), a laptop computer, a personal computer, a tablet computer, a wireless communication card, or any other similar device configured to communicate within the system 100.

A terminal 106 may or may not be capable of receiving signals from one or more satellites 108. In some embodiments, the satellites 108 may belong to a satellite positioning system such as the well-known Global Positioning System (GPS). Additionally, a terminal 106 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 106 is shown as receiving signals from multiple transmitting sources simultaneously, where a transmitting source may be an access point 104 or a satellite 108. In certain embodiments, a terminal 106 may also be a transmitting source. In general, a terminal 106 may receive signals from zero, one, or multiple transmitting sources at any given moment. Additionally, for simplicity, only two terminals 106 and two access points 104 are shown in FIG. 1; however, the system 100 may include any number of terminals 106 and access points 104.

Figure 2:
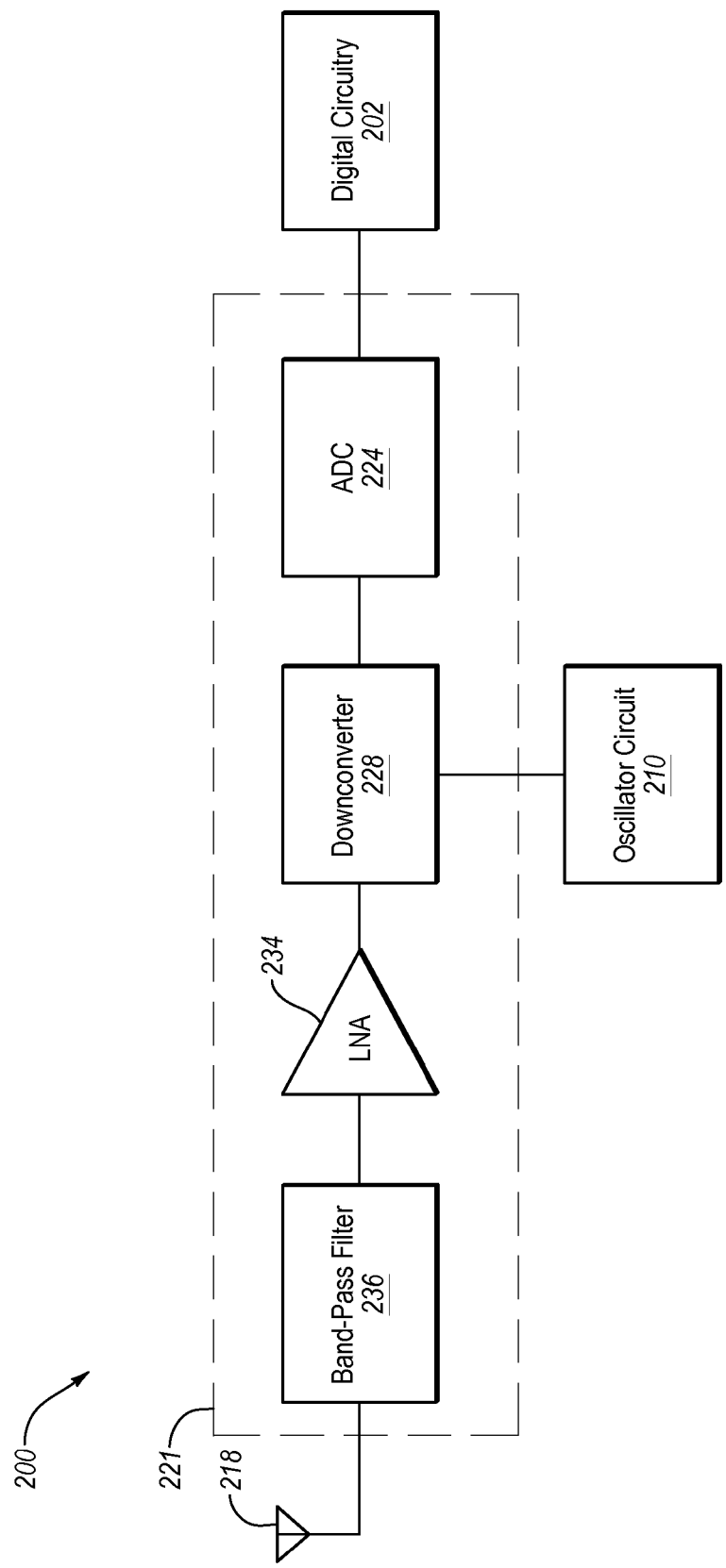
FIG. 2 illustrates a block diagram of selected components of an example transmitting and/or receiving element.

FIG. 2 illustrates a block diagram of selected components of an example transmitting and/or receiving element 200 (e.g., a terminal 106, an access point 104, or a satellite 108 of FIG. 1), arranged in accordance with at least one embodiment described herein. In the illustrated embodiment, the element 200 may include a receive path 221, digital circuitry 202, and an oscillator circuit 210. In some embodiments, the element 200 may also include a transmit path (not expressly depicted). Accordingly, depending on the functionality of the element 200, the element 200 may be considered a transmitter, a receiver, or a transceiver.

The digital circuitry 202 may include any system, device, or apparatus configured to process signals and information received via the receive path 221 of the element 200. In some embodiments, the digital circuitry 202 may also be configured to process signals and information for transmission via a transmit path of the element 200. The digital circuitry 202 may include one or more microprocessors, microcontrollers, digital signal processors (DSP), application-specific integrated circuits (ASIC), a Field Programmable Gate Array (FPGA), or any other digital or analog circuitry configured to interpret and/or execute program instructions and/or to process data and/or signals. In some embodiments, the program instructions and/or process data may be stored in memory included in or otherwise accessible to the digital circuitry 202.

The memory may include any suitable computer-readable media configured to retain program instructions and/or data for a period of time. By way of example, and not limitation, such computer-readable media may include tangible and/or non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other tangible and/or non-transitory storage medium which may be used to carry or store desired program code in the form of computer-executable instructions or data structures and which may be accessed by the processor. Combinations of the above may also be included within the scope of computer-readable media. Computer-executable instructions may include, for example, instructions and data that cause a general purpose computer, special purpose computer, or special purpose processing device (e.g., a processor) to perform a certain function or group of functions.

The oscillator circuit 210 may be any suitable device, system, or apparatus configured to produce a waveform of a particular frequency for demodulation or down-conversion of a wireless communication signal that may be received by an antenna 218 of the element 200. In some embodiments, the oscillator circuit 210 may also be used for modulation or up-conversion of a signal to an applicable radio frequency for transmission at the applicable radio frequency by the element 200. Accordingly, in some embodiments, the oscillator circuit 210 may produce a clock signal that may be used for modulation or demodulation of signals.

In some embodiments, the receive path 221 may include a band-pass filter 236 configured to receive a wireless communication signal (e.g., transmitted by a terminal 106, an access point 104 and/or a satellite 108 of FIG. 1) via the antenna 218. The band-pass filter 236 may be configured to pass signal components in the band of interest associated with the received wireless communication signal (e.g., the transmission frequency band) and remove out-of-band noise and other undesired signals. In addition, the receive path 221 may include a low-noise amplifier (LNA) 234 configured to amplify signals filtered by the band-pass filter 236.

The receive path 221 may also include a downconverter 228. The downconverter 228 may be configured to frequency down-convert and demodulate the wireless communication signal received via the antenna 218 and amplified by the LNA 234 by using a clock signal that may be provided by the oscillator circuit 210. In some embodiments, the signal received by the downconverter 228 from the LNA 234 or other upstream component may be a quadrature signal that may include I-channel and Q-channel components. Accordingly, the oscillator circuit 210 may be configured to generate I-channel and Q-channel signals that may be used to demodulate the I-channel and Q-channel components of the signal received by the downconverter 228. As detailed below with respect to FIGS. 3A-4B, in some embodiments, the oscillator circuit 210 may be configured to generate the I-channel signals and the Q-channel signals such that they have a duty cycle of less than or equal to 25%, which may improve the ability to extract information from the wireless signal received at the antenna 218 compared to implementations in which the duty cycle is more than 25%.

In addition, the receive path 221 may include an analog-to-digital converter (ADC) 224 configured to receive an analog signal down-converted by the downconverter 228 and convert such analog signal into a digital signal. Such digital signal may then be passed to the digital circuitry 202 for processing.

Modifications, additions, or omissions may be made to the element 200 without departing from the scope of the present disclosure. For example, the element 200 may include any number of components not expressly described and illustrated. Further, additional components may be communicatively coupled between the components expressly described and illustrated. Additionally, in some embodiments, one or more of the expressly illustrated and described components of the element 200 may be omitted. Also, although the oscillator circuit 210 and the downconverter 228 are described as being included in the element 200, the oscillator circuit 210 and the downconverter 228 may be included in any suitable system, apparatus, or device to demodulate signals. Accordingly, implementations of the oscillator circuit 210 and the downconverter 228 are not limited to wireless communication applications.

Figure 3A:
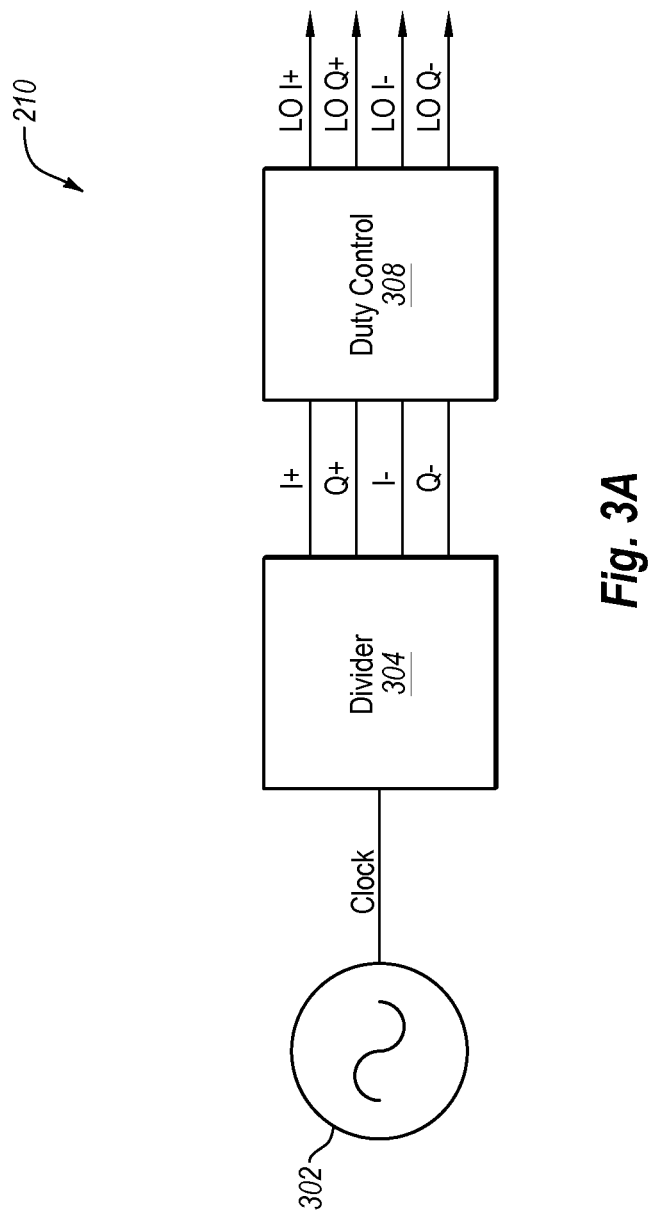
FIG. 3A illustrates a block diagram of an example embodiment of an oscillator circuit of FIG. 2.

FIG. 3A illustrates a block diagram of an example embodiment of the oscillator circuit 210 of FIG. 2, arranged in accordance with at least one embodiment described herein. As mentioned above, the oscillator circuit 210 may be configured to generate I-channel and Q-channel signals that may be used by the downconverter 228 (not expressly depicted in FIG. 3A) for demodulation of signals received by the downconverter 228.

In some embodiments, the oscillator circuit 210 may include an oscillator 302 configured to generate a clock signal. In these and other embodiments, the oscillator 302 may be configured to generate the clock signal at a frequency that is related to the transmission frequency of the wireless signal received by the antenna 218 such that demodulation of the wireless signal may be based on the frequency of the clock signal. In some embodiments, the oscillator 302 may be a voltage controlled oscillator (VCO) configured to generate the clock signal at the desired frequency based on a control voltage. The control voltage may be received by the oscillator 302 in some embodiments from the digital circuitry 202 (not expressly depicted in FIG. 3A).

The oscillator circuit 210 may also include a divider module 304 configured to receive the clock signal generated by the oscillator 302. In some embodiments, the divider module 304 may be configured to generate a positive I-channel (I+) signal, a positive Q-channel (Q+) signal, a negative I-channel (I−) signal, and a negative Q-channel (Q−) signal based on the clock signal generated by the oscillator 302. In some embodiments, the I− signal output by the divider module 304 may be a complement of the I+ signal output by the divider module 304 and the Q− signal output by the divider module 304 may be a complement of the Q+ signal output by the divider module 304. The divider module 304 may be any suitable system, apparatus, or device configured to generate the I+ signal, the Q+ signal, the I− signal, and the Q− signal.

The oscillator circuit 210 may also include a duty control module 308 configured to receive the I+ signal, the Q+ signal, the I− signal, and the Q− signal that may be generated by the divider module 304. The duty control module 308 may be configured to reduce the duty cycles of the I+ signal, the Q+ signal, the I− signal, and the Q− signal to generate a truncated I+ signal, a truncated Q+ signal, a truncated I− signal, and a truncated Q− signal (illustrated as "LO I+," "LO Q+," "LO I−," and "LO Q−," respectively, in FIG. 3A).

In some embodiments, and as described in further detail below with respect to FIGS. 4A and 4B, the duty control module 308 may be configured to reduce the duty cycles of the I+ signal, the Q+ signal, the I− signal, and the Q− signal such that the duty cycles of the truncated I+ signal, the truncated Q+ signal, the truncated I− signal, and the truncated Q− signal may be less than or equal to 25%.

Figure 3B:
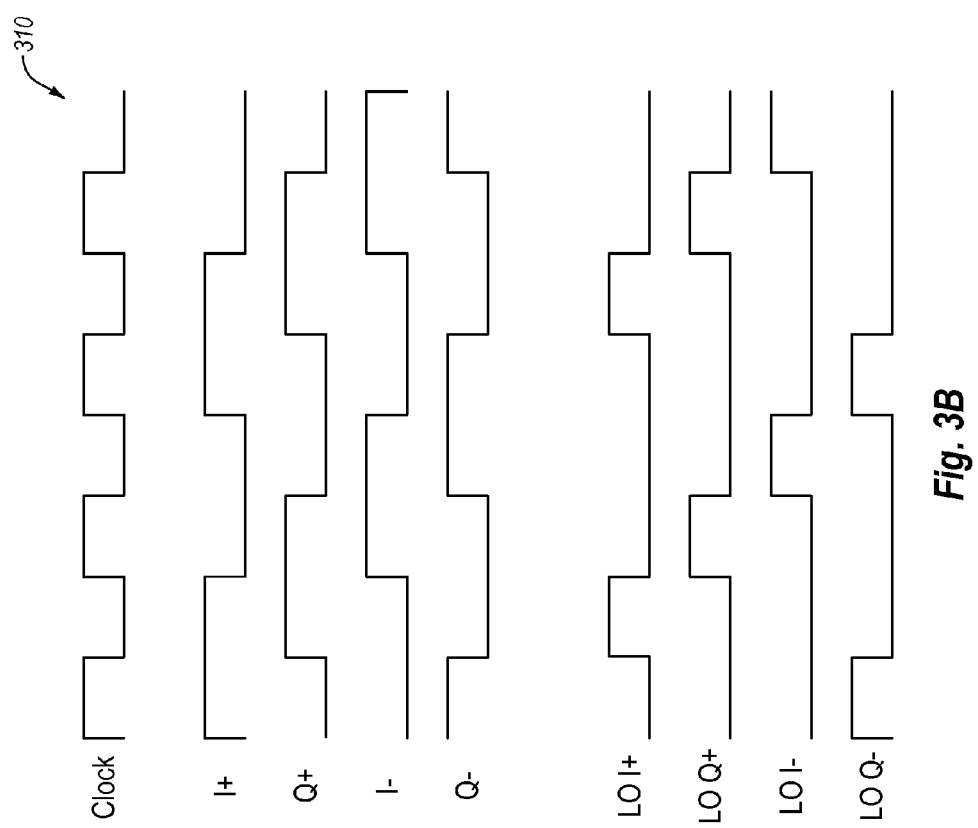
FIG. 3B illustrates a timing diagram of signals that may be related to the oscillator circuit of FIG. 3A.

FIG. 3B illustrates a timing diagram 310 of ideal waveforms of signals related to the oscillator circuit 210 of FIG. 3A. In the timing diagram 310, the clock signal generated by the oscillator 302 may be represented by "Clock," the I+ signal, the Q+ signal, the I− signal, and the Q− signal generated by the divider module 304 may be represented by "I+," "Q+," "I−," and "Q−," respectively, and the truncated I+ signal, the truncated Q+ signal, the truncated I− signal, and the truncated Q− signal that may be generated by the duty control module 308 may be represented by "LO I+," "LO Q+," "LO I−," and "LO Q−," respectively.

In the timing diagram 310, the phase of the Q+ signal may lag the phase of the I+ signal by 90 degrees. Additionally, the I− signal may be the complement of the I+ signal and the Q− signal may be the complement of the Q+ signal. Accordingly, as illustrated in the timing diagram 310, the phase of the I− signal may lag the phase of the Q+ signal by 90 degrees and the phase of the Q− signal may lag the phase of the I− signal by 90 degrees. Similarly, the phase of the truncated Q+ signal may lag the phase of the truncated I+ signal by 90 degrees, the phase of the truncated I− signal may lag the phase of the truncated Q+ signal by 90 degrees, and the phase of the truncated Q− signal may lag the phase of the truncated I− signal by 90 degrees.

Additionally, in the timing diagram 310, the I+ signal, the Q+ signal, the I− signal, and the Q− signal generated by the divider module 304 and the truncated I+ signal, the truncated Q+ signal, the truncated I− signal, and the truncated Q− signal generated by the duty control module 308 may each have a period that is twice that of the clock signal generated by the oscillator 302. However, in the illustrated embodiment, the truncated I+ signal, the truncated Q+ signal, the truncated I− signal, and the truncated Q− signal generated by the duty control module 308 may have a duty cycle of 25%, which may be reduced from the 50% duty cycle of the I+ signal, the Q+ signal, the I− signal, and the Q− signal generated by the divider module 304. Accordingly, due to the 25% duty cycle and phase lags of the truncated I+, Q+, I−, and Q− signals, each of the truncated I+, Q+, I−, and Q− signals may be asserted "HIGH" at different times.

FIG. 3B is merely meant to illustrate the relationship between signals that may be associated with the oscillator circuit 210 and does not necessarily represent the actual signals generated by or within the oscillator circuit 210. For example, the signals illustrated in the timing diagram 310 are represented as ideal signals that may not include rise and fall times, or delays. In contrast, as explained further with respect to FIGS. 4A and 4B as well as FIG. 5, the actual signals generated by and within the oscillator circuit 210 may have rise and fall times in addition to delays. Consequently, the duty cycles depicted in the timing diagram 310 may vary from the duty cycles of the actual signals generated by or within the oscillator circuit 210.

Additionally, the timing at which the truncated I+, Q+, I−, and Q− signals may be asserted "HIGH" with respect to the I+ signal, the Q+ signal, the I− signal, and the Q− signal may vary depending on particular implementations. For example, in the illustrated embodiment, the truncated I+ signal may be asserted "HIGH" when the I+ and Q+ signals are asserted "HIGH," the truncated Q+ signal may be asserted "HIGH" when the I− and Q+ signals are asserted "HIGH," the truncated I− signal may be asserted "HIGH" when the I− and Q− signals are asserted "HIGH," and the truncated Q− signal may be asserted "HIGH" when the I+ and Q− signals are asserted "HIGH." The relationships in the illustrated embodiment of FIG. 3B may occur with respect to implementing the duty control module 308 in a manner as described with respect to FIGS. 4A and 4B.

Figure 4A:
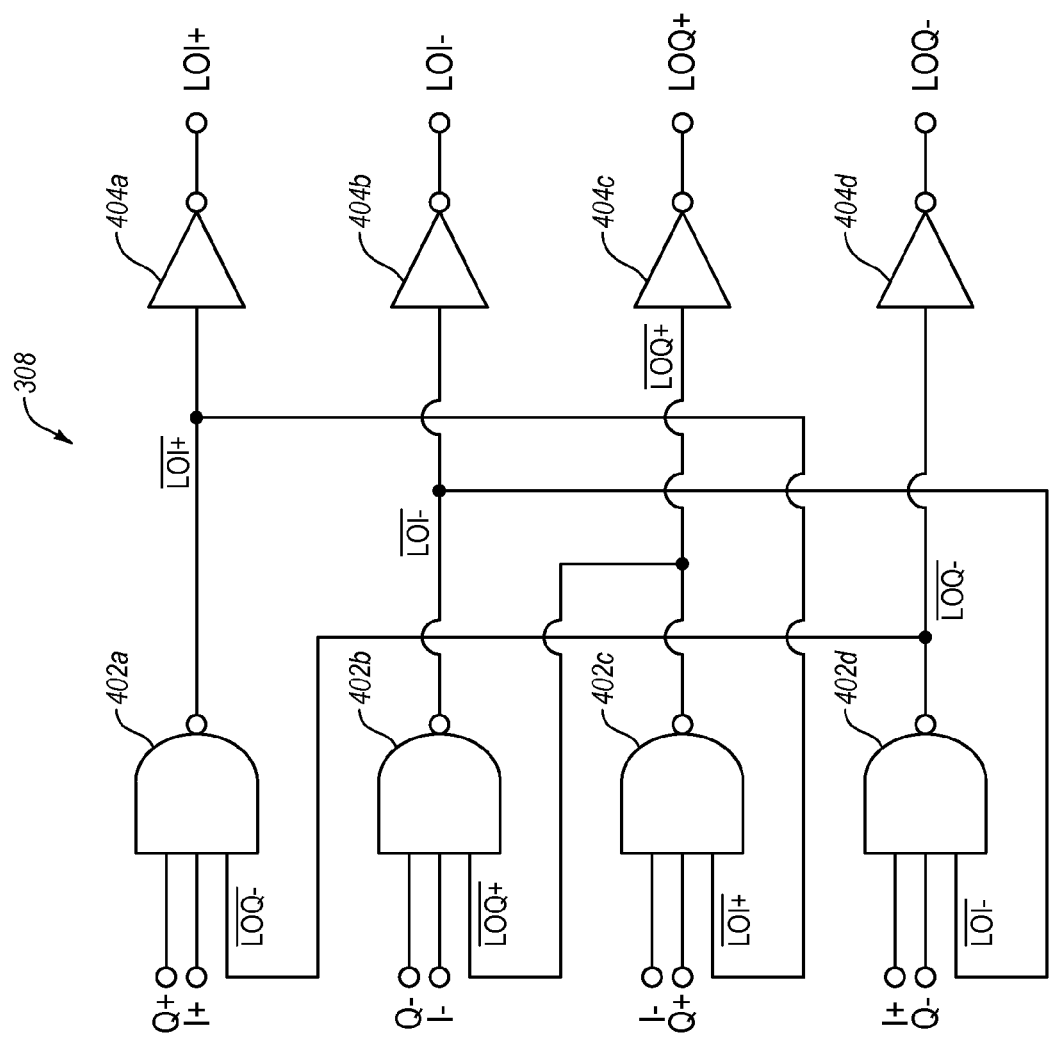
FIG. 4A illustrates a block diagram of an example embodiment of a duty control module of FIG. 3A.
Figure 4B:
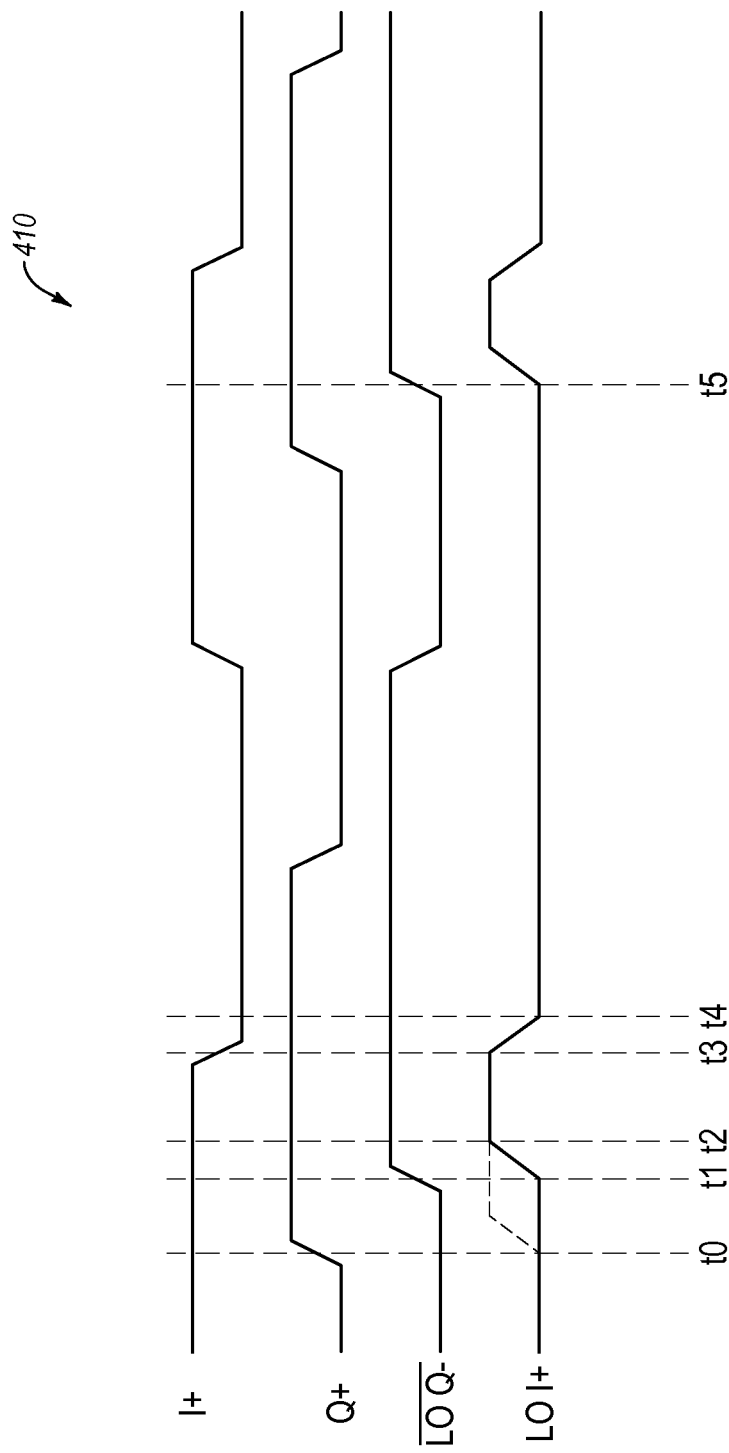
FIG. 4B illustrates a timing diagram of signals that may be related to the duty control module of FIG. 4A.
Figure 5:
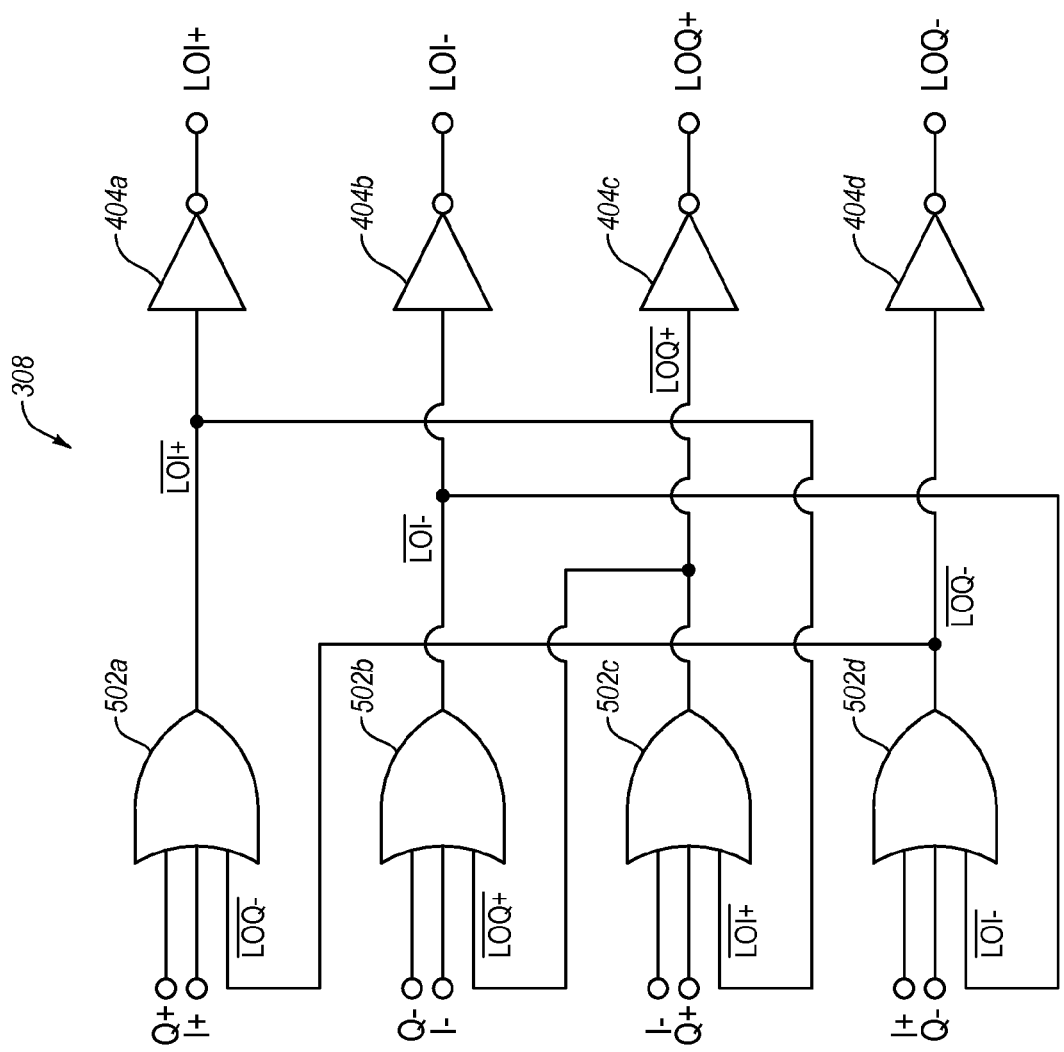
FIG. 5 illustrates a block diagram of another example embodiment of the duty control module of FIG. 3A.

In alternative embodiments, such as an implementation of the duty control module 308 as illustrated in FIG. 5, the truncated I+ signal may be asserted "HIGH" when the I+ and Q+ signals are asserted "LOW," the truncated Q+ signal may be asserted "HIGH" when the I− and Q+ signals are asserted "LOW," the truncated I− signal may be asserted "HIGH" when the I− and Q− signals are asserted "LOW," and the truncated Q− signal may be asserted "HIGH" when the I+ and Q− signals are asserted "LOW." Accordingly, in the embodiment associated with FIG. 5, the relationships between the truncated I+, Q+, I−, and Q− signals with respect to the I+ signal, the Q+ signal, the I− signal, and the Q− signal may vary than in the embodiment associated with FIGS. 4A and 4B. However, the phase relationships of the truncated I+, Q+, I−, and Q− signals with respect to each other may be substantially the same in the embodiments associated with FIGS. 4A, 4B and 5.

FIG. 4A illustrates a block diagram of an example embodiment of the duty control module 308 of FIG. 3A, arranged in accordance with at least one embodiment described herein. As mentioned above, the duty control module 308 may be configured to receive the I+ signal (illustrated as "I+" in FIG. 4A), the Q+ signal (illustrated as "Q+" in FIG. 4A), the I− signal (illustrated as "I−" in FIG. 4A), and the Q− signal (illustrated as "Q−" in FIG. 4A) that may be generated by the divider module 304 (not included in FIG. 4A) to generate the truncated I+ signal (illustrated as "LO I+" in FIG. 4A), the truncated Q+ signal (illustrated as "LO Q+" in FIG. 4A), the truncated I− signal (illustrated as "LO I−" in FIG. 4A), and the truncated Q− signal (illustrated as "LO Q−" in FIG. 4A). In some embodiments, the duty control module 308 of the illustrated embodiment may be configured to generate the truncated I+ signal, the truncated Q+ signal, the truncated I− signal, and the truncated Q− signal such that the truncated I+ signal, the truncated Q+ signal, the truncated I− signal, and the truncated Q− signal have a duty cycle that is less than 25%.

In the illustrated embodiment of FIG. 4A, the duty control module 308 may include a negating AND (NAND) gate 402a, a NAND gate 402b, a NAND gate 402c, and a NAND gate 402d. The duty control module 308 may also include an inverter 404a communicatively coupled to an output of the NAND gate 402a, an inverter 404b communicatively coupled to an output of the NAND gate 402b, an inverter 404c communicatively coupled to an output of the NAND gate 402c, and an inverter 404d communicatively coupled to an output of the NAND gate 402d.

In the illustrated embodiment, the NAND gate 402a may be configured to generate a complement of the truncated I+ signal (illustrated as "$\overline{LOI+}$" in FIG. 4A) such that the inverter 404a may receive and invert the complement of the truncated I+ signal to generate the truncated I+ signal. Additionally, the NAND gate 402b may be configured to generate a complement of the truncated I− signal (illustrated as "$\overline{LOI-}$" in FIG. 4A) such that the inverter 404b may receive and invert the complement of the truncated I− signal to generate the truncated I− signal. Further, the NAND gate 402c may be configured to generate a complement of the truncated Q+ signal (illustrated as "$\overline{LOQ+}$" in FIG. 4A) such that the inverter 404c may receive and invert the complement of the truncated Q+ signal to generate the truncated Q+ signal. In addition, the NAND gate 402d may be configured to generate a complement of the truncated Q− signal (illustrated as "$\overline{\text{LOQ-}}$" in FIG. 4A) such that the inverter 404d may receive and invert the complement of the truncated Q− signal to generate the truncated Q− signal.

In some embodiments, the NAND gate 402a may be configured to generate the complement of the truncated I+ signal based on the complement of the truncated Q− signal generated by the NAND gate 402d and based on the Q+ signal and the I+ signal generated by the divider module 304 of FIG. 3A. The NAND gate 402b may be configured to generate the complement of the truncated I− signal based on the complement of the truncated Q+ signal generated by the NAND gate 402c and based on the Q− signal and the I− signal generated by the divider module 304 of FIG. 3A. Further, the NAND gate 402c may be configured to generate the complement of the truncated Q+ signal based on the complement of the truncated I+ signal generated by the NAND gate 402a and based on the Q+ signal and the I− signal generated by the divider module 304 of FIG. 3A. Additionally, the NAND gate 402d may be configured to generate the complement of the truncated Q− signal based on the complement of the truncated I− signal generated by the NAND gate 402b and based on the Q− signal and the I+ signal generated by the divider module 304 of FIG. 3A.

For example, the NAND gate 402a may be configured to receive as inputs the Q+ signal and the I+ signal that may be generated by the divider module 304 of FIG. 3A. The NAND gate 402a may also be configured to receive the output of the NAND gate 402d as an input, which may be the complement of the truncated Q− signal. The NAND gate 402a may accordingly be configured such that its output (e.g., the complement of the truncated I+ signal) may be asserted "LOW" when the Q+ signal, the I+ signal, and the complement of the truncated Q− signal are each asserted "HIGH." Additionally, as mentioned above, the inverter 404a may be configured to receive and invert the complement of the truncated I+ signal such that the truncated I+ signal may be asserted "HIGH" when the Q+ signal, the I+ signal, and the complement of the truncated Q− signal are each asserted "HIGH."

The NAND gate 402b and the inverter 404b may be similarly configured with respect to the Q− signal, the I− signal, and the complement of the truncated Q+ signal to generate the truncated I− signal. Further, the NAND gate 402c and the inverter 404c may be similarly configured with respect to the Q+ signal, the I− signal, and the complement of the truncated I+ signal to generate the truncated Q+ signal. Additionally, the NAND gate 402d and the inverter 404d may be similarly configured with respect to the Q− signal, the I+ signal, and the complement of the truncated I− signal to generate the truncated Q− signal.

As mentioned above, and illustrated in FIG. 4A, the outputs of each of the NAND gates 402 may be based on the output of another NAND gate 402. Additionally, each NAND gate 402 may include a delay from the time that the NAND gate 402 receives a change in an input and from the time that the NAND gate 402 outputs a signal based on the change in the input. In the illustrated embodiment, the delays associated with the NAND gates 402 may cause a delay in the complement of each truncated signal from being asserted "HIGH" to being asserted "LOW," which may in turn cause a delay in each truncated signal from being asserted "LOW" to being asserted "HIGH." However, because one of the I or Q signals received by the NAND gates 402 may go "LOW" before the complement of the associated truncated signal may go "LOW," the delay associated with the associated truncated signal going "LOW" may be less than the delay associated with the associated truncated signal going "HIGH."

The delay in each truncated signal from being asserted "LOW" to being asserted "HIGH" being greater than the delay in each truncated signal from being asserted "HIGH" to being asserted "LOW" may consequently reduce the amount of time that each truncated signal may be asserted "HIGH," than if the output of another NAND 402 was not used as an input. As such, configuring the NAND gates 402 and inverters 404 as depicted in FIG. 4A may reduce the duty cycles of the truncated I and Q signals.

For example, FIG. 4B illustrates a timing diagram 410 of signals that may be related to the duty control module 308 of FIG. 4A. The timing diagram illustrates examples of the I+ signal (illustrated as "I+" in FIG. 4B), the Q+ signal (illustrated as "Q+" in FIG. 4B), and the complement of the truncated Q− signal (illustrated as "$\overline{\text{LOQ-}}$" in FIG. 4B) that may be received by the NAND gate 402a of FIG. 4A. The timing diagram 410 also illustrates the truncated I+ signal (illustrated as "LO I+") that may be output by the inverter 404a of FIG. 4A that may be communicatively coupled to the output of the NAND gate 402a.

At a time "t1," the I+ signal may be asserted "HIGH," the Q+ signal may be asserted "HIGH," and the truncated Q− signal may be sufficiently asserted "HIGH" (which may correspond to the inputs of the NAND gate 402a) such that the truncated I+ signal (which may be output by the inverter 404a and which may be based on the output of the NAND gate 402a) may begin to transition from being asserted "LOW" to being asserted "HIGH." At a time "t2," a rise time (e.g., the time between the time "t1" and the time "t2") of the truncated I+ signal may have passed such that the truncated I+ signal may be asserted "HIGH." At a time "t3," the I+ signal received by the NAND gate 402a may be sufficiently asserted "LOW" such that the output of inverter 404a—which may correspond to the truncated I+ signal and may be based on the output of the NAND gate 402a—may begin to transition from being asserted "HIGH" to being asserted "LOW." At a time "t4," a fall time (e.g., the time between the time "t3" and the time "t4") of the truncated I+ signal may have passed such that the truncated I+ signal may be asserted "LOW." The process may begin over again at a time "t5" when the I+ signal may be asserted "HIGH," the Q+ signal may be asserted "HIGH," and the truncated Q− signal may be sufficiently asserted "HIGH" at the same time again.

As illustrated in FIG. 4B, the duty cycle of the truncated I+ signal may be less than 25%. Additionally, the duty cycle of the truncated I+ signal may be reduced by including the complement of the truncated Q− signal as an input for the NAND gate 402a. For example, if the I+ and Q+ signals were used as inputs for the NAND gate 402a, and the complement of the truncated Q− signal was excluded as an input for the NAND gate 402a, the duty cycle of the truncated I+ signal may begin at about a time "t0" instead of a time "t1," but may still end at the time "t4." Accordingly, the duty cycle of the truncated I+ signal may be reduced by the difference between the time "t0" and the time "t1" in the illustrated embodiments of FIGS. 4A and 4B, as compared to if the complement of the truncated Q− signal were excluded as an input to the NAND gate 402a. The duty cycles of the truncated I−, Q+, and Q− signals may similarly be reduced through implementing the duty control module 308 as described with respect to FIG. 4A.

In some embodiments, different logic gates may be used other than the NAND gates 402 illustrated in FIG. 4A. For example, in some embodiments, the NAND gates 402 may be replaced with AND gates and inverters that may functionally act as NAND gates. Further, as illustrated in FIG. 5, in some embodiments the NAND gates 402 may be replaced by OR gates.

FIG. 5 illustrates a block diagram of another example embodiment of the duty control module 308 of FIG. 3A, arranged in accordance with at least one embodiment described herein. The duty control module 308 of FIG. 5 may be similar to the duty control module 308 of FIG. 4A, with the difference being that the NAND gates 402 of FIG. 4A may be replaced with OR gates 502 as illustrated in FIG. 5. For example, the NAND gate 402a of FIG. 4A may be replaced with an OR gate 502a in FIG. 5, the NAND gate 402b of FIG. 4A may be replaced with an OR gate 502b in FIG. 5, the NAND gate 402c of FIG. 4A may be replaced with an OR gate 502c in FIG. 5, and the NAND gate 402d of FIG. 4A may be replaced with an OR gate 502d in FIG. 5, The use of the OR gates 502 in FIG. 5 may result in the truncated I+ signal being asserted "HIGH" when the I+ signal, the Q+ signal and the complement of the truncated Q− signal are asserted "LOW," the truncated Q+ signal being asserted "HIGH" when the I− signal, the Q+ signal, and the complement of the truncated I+ signal are asserted "LOW," the truncated I− signal being asserted "HIGH" when the I− signal, the Q− signal, and the complement of the truncated Q+ signal are asserted "LOW," and the truncated Q− signal being asserted "HIGH" when the I+ signal, the Q− signal, and the complement of the truncated I− signal are asserted "LOW." In contrast, the use of the NAND gates 402 in FIG. 4A may result in the truncated I+ signal being asserted "HIGH" when the I+ signal, the Q+ signal and the complement of the truncated Q− signal are asserted "HIGH," the truncated Q+ signal being asserted "HIGH" when the I− signal, the Q+ signal, and the complement of the truncated I+ signal are asserted "HIGH," the truncated I− signal being asserted "HIGH" when the I− signal, the Q− signal, and the complement of the truncated Q+ signal are asserted "HIGH," and the truncated Q− signal being asserted "HIGH" when the I+ signal, the Q− signal, and the complement of the truncated I− signal are asserted "HIGH."

However, the phase relationships between the truncated I+, Q+, I−, and Q− signals that may be generated by the duty control module 308 of FIG. 5 may be substantially the same as the phase relationships between the truncated I+, Q+, I−, and Q− signals that may be generated by the duty control module 308 of FIG. 4A. Additionally, configuring the OR gates 502 to receive their respective signals as illustrated in FIG. 5 may also create delays in a manner analogous to that described above with respect to FIGS. 4A and 4B such that the duty cycles of the truncated I+, Q+, I−, and Q− signals that may be generated by the duty control module 308 of FIG. 5 may be reduced in a manner substantially similar to the reduction in duty cycles of the truncated I+, Q+, I−, and Q− signals that may be generated by the duty control module 308 of FIG. 4A.

Therefore, configuring the oscillator circuit 210 and duty control module 308 in a manner as described with respect to FIGS. 3A, 4A and 5 may reduce a duty cycle of quadrature-based signals (e.g., the I+, I−, Q+, Q− signals). As mentioned above, in some embodiments, the quadrature signals with the reduced duty cycles (e.g., the truncated I+, I−, Q+, Q− signals) may be used for demodulation of signals modulated using a quadrature-type modulation scheme.

Figure 6:
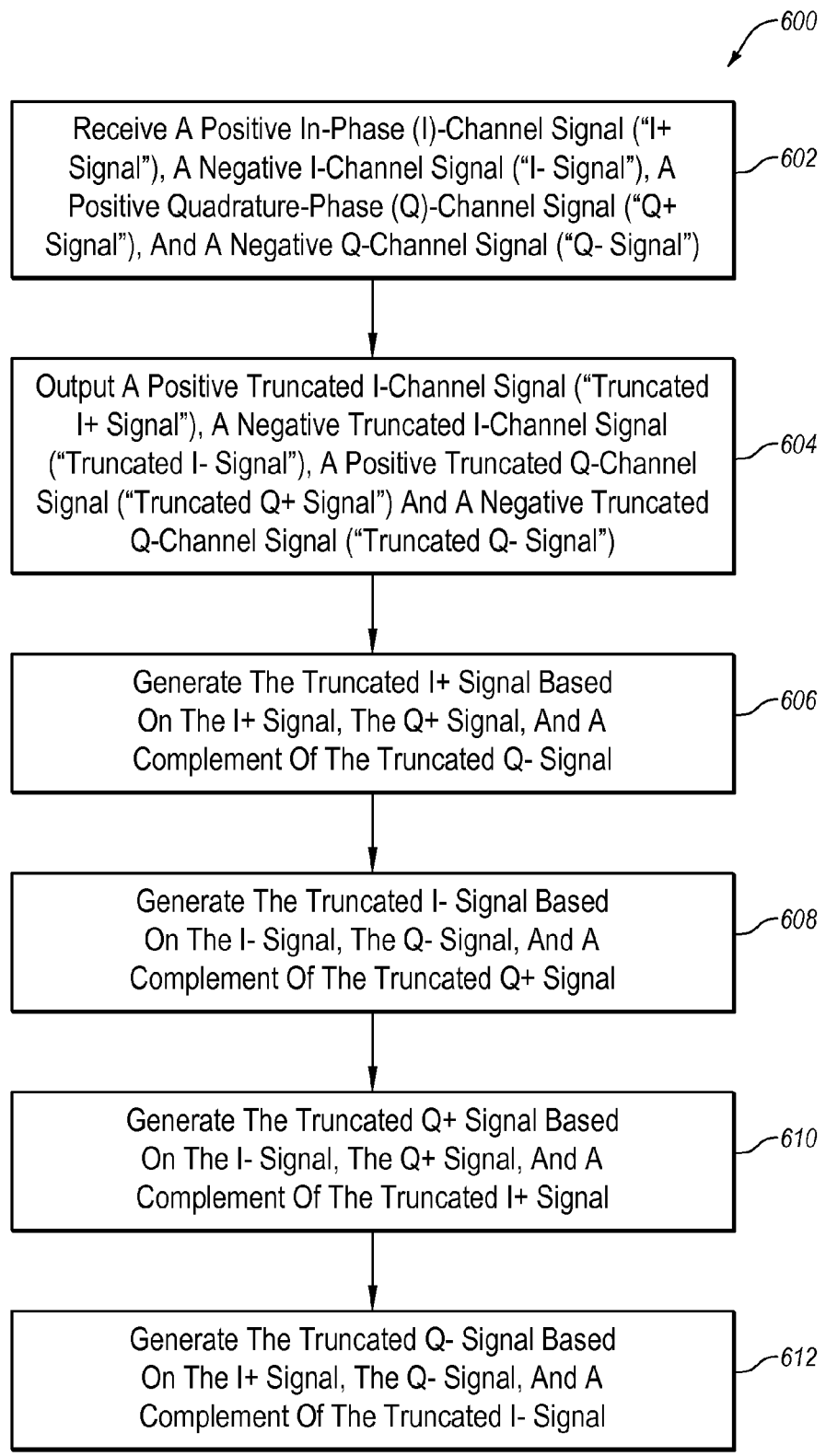
FIG. 6 is a flowchart of an example method of reducing a duty cycle of one or more signals.

Modifications, additions, or omissions may be made to FIGS. 3A-5, without departing from the scope of the present disclosure. For example, although the above description has been given with respect to wireless communications and quadrature-based modulation, the above-described embodiments may be used for any suitable application where a duty cycle of a signal may be desired. Additionally, the waveforms presented in FIGS. 3B and 4B are merely to illustrate concepts of operation of the circuits and modules depicted in FIGS. 3A and 4A. Actual waveforms of circuits and modules generated based on the above description may vary. Further, the waveforms and timing diagrams associated with the duty control module 308 of FIG. 5 may vary as compared to the waveforms and timing diagrams depicted in FIGS. 3B and 4B due at least in part to the configuration differences. Additionally, logic gates other than the NAND and OR gates described above may be used. FIG. 6 is a flowchart of an example method 600 of reducing a duty cycle of one or more signals (e.g., quadrature signals), arranged in accordance with at least one embodiment described herein. The method 600 may be implemented, in some embodiments, by one or more components of a duty control module, such as the duty control module 308 of FIGS. 3A and 4A. Although illustrated as discrete blocks, various blocks may be divided into additional blocks, combined into fewer blocks, or eliminated, depending on the desired implementation.

The method 600 may begin, and at block 602 a positive in-phase ("I")-channel signal ("I+ signal"), a negative I-channel signal ("I− signal"), a positive quadrature-phase ("Q")-channel signal ("Q+ signal"), and a negative Q-channel signal ("Q− signal") may be received. At block 604, a positive truncated I-channel signal ("truncated I+ signal"), a negative truncated I-channel signal ("truncated I− signal"), a positive truncated Q-channel signal ("truncated Q+ signal"), and a negative truncated Q-channel signal ("truncated Q− signal") may be output. The truncated I+ signal may have a reduced duty cycle with respect to the I+ signal, the truncated I− signal may have a reduced duty cycle with respect to the I− signal, the truncated Q+ signal may have a reduced duty cycle with respect to the Q+ signal, and the truncated Q− signal may have a reduced duty cycle with respect to the Q− signal. In some embodiments, the duty cycles of the truncated I+, I−, Q+, and Q− signals may be less than 25%.

At block 606, the truncated I+ signal may be generated based on the I+ signal, the Q+ signal, and a complement of the truncated Q− signal. At block 608, the truncated I− signal may be generated based on the I− signal, the Q− signal, and a complement of the truncated Q+ signal. At block 610, the truncated Q+ signal may be generated based on the I− signal, the Q+ signal, and a complement of the truncated I+ signal. At block 612, the truncated Q− signal may be generated based on the I+ signal, the Q− signal, and a complement of the truncated I− signal. In some embodiments, the truncated I+, I−, Q+, and Q− signals may be generated by performing an AND operation with respect to the respective signals of which they may be based.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, in some embodiments, the method 600 may include additional steps associated with performing a NAND operation with respect to the AND operations described above. Additionally, the method 600 may include steps associated with generating the I+ signal, the I− signal, the Q+ signal, and the Q− signal based on clock signal. In these and other embodiments, the method 600 may include steps associated with generating the clock signal at a frequency that is associated with demodulating a wireless communication signal.

The embodiments described herein may include the use of a special purpose or general purpose computer including various computer hardware or software modules, as discussed in greater detail below.

Embodiments described herein may include computer-readable media for carrying or having computer-executable instructions or data structures stored thereon. As mentioned above with respect to the control unit, such computer-readable media may be any available media that may be accessed by a general purpose or special purpose computer. Additionally, computer-executable instructions may include, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the terms "module" or "component" may refer to specific hardware implementations configured to perform the operations of the module or component and/or software objects or software routines that may be stored on and/or executed by general purpose hardware (e.g., computer-readable media, processing devices, etc.) of the computing system. In some embodiments, the different components, modules, engines, and services described herein may be implemented as objects or processes that execute on the computing system (e.g., as separate threads). While some of the systems and methods described herein are generally described as being implemented in software (stored on and/or executed by general purpose hardware), specific hardware implementations or a combination of software and specific hardware implementations are also possible and contemplated. In this description, a "computing entity" may be any computing system as previously defined herein, or any module or combination of modules running on a computing system.

All examples and conditional language recited herein are intended for pedagogical objects to aid the reader in understanding the present disclosure and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. A circuit comprising:
one or more inputs configured to receive a positive in-phase ("I")-channel signal ("I+ signal"), a negative I-channel signal ("I− signal"), a positive quadrature-phase ("Q")-channel signal ("Q+ signal"), and a negative Q-channel signal ("Q− signal");
one or more outputs configured to output a positive truncated I-channel signal ("truncated I+ signal"), a negative truncated I-channel signal ("truncated I− signal"), a positive truncated Q-channel signal ("truncated Q+ signal"), and a negative truncated Q-channel signal ("truncated Q− signal"), the truncated I+ signal having a reduced duty cycle with respect to the I+ signal, the truncated I− signal having a reduced duty cycle with respect to the I− signal, the truncated Q+ signal having a reduced duty cycle with respect to the Q+ signal, and the truncated Q− signal having a reduced duty cycle with respect to the Q− signal;
a first logic gate configured to perform a logic operation with respect to the I+ signal, the Q+ signal, and a complement of the truncated Q− signal to generate the truncated I+ signal;
a second logic gate configured to perform the logic operation with respect to the I− signal, the Q− signal, and a complement of the truncated Q+ signal to generate the truncated I− signal;
a third logic gate configured to perform the logic operation with respect to the I− signal, the Q+ signal, and a complement of the truncated I+ signal to generate the truncated Q+ signal; and
a fourth logic gate configured to perform the logic operation with respect to the I+ signal, the Q− signal, and a complement of the truncated I− signal to generate the truncated Q− signal.

2. The circuit of claim 1, wherein:
the first logic gate is configured to output the complement of the truncated I+ signal;
the second logic gate is configured to output the complement of the truncated I− signal;
the third logic gate is configured to output the complement of the truncated Q+ signal; and
the fourth logic gate is configured to output the complement of the truncated Q− signal.

3. The circuit of claim 2, wherein the logic operation includes an AND operation or an OR operation.

4. The circuit of claim 2, further comprising:
a first inverter configured to generate the truncated I+ signal based on the complement of the truncated I+ signal output by the first logic gate;
a second inverter configured to generate the truncated I− signal based on the complement of the truncated I− signal output by the second logic gate;
a third inverter configured to generate the truncated Q+ signal based on the complement of the truncated Q+ signal output by the third logic gate; and
a fourth inverter configured to generate the truncated Q− signal based on the complement of the truncated Q− signal output by the fourth logic gate.

5. The circuit of claim 1, wherein one or more of the truncated I+ signal, the truncated I− signal, the truncated Q+ signal, and the truncated Q− signal has a duty cycle of 25% or less.

6. The circuit of claim 1, further comprising a divider module configured to generate the I+ signal, the I− signal, the Q+ signal, and the Q− signal based on a clock signal generated by a voltage controlled oscillator ("VCO").

7. The circuit of claim 6, wherein the VCO is configured to generate the clock signal at a frequency that is associated with demodulating a wireless communication signal.

8. A circuit comprising:
one or more inputs configured to receive a positive in-phase ("I")-channel signal ("I+ signal"), a negative I-channel signal ("I− signal"), a positive quadrature-phase ("Q")-channel signal ("Q+ signal"), and a negative Q-channel signal ("Q− signal");
one or more outputs configured to output a positive truncated I-channel signal ("truncated I+ signal"), a negative truncated I-channel signal ("truncated I− signal"), a positive truncated Q-channel signal ("truncated Q+ signal"), and a negative truncated Q-channel signal ("truncated Q− signal"), the truncated I+ signal having a reduced duty cycle with respect to the I+ signal, the truncated I− signal having a reduced duty cycle with respect to the I− signal, the truncated Q+ signal having a reduced duty cycle with respect to the Q+ signal, and the truncated Q− signal having a reduced duty cycle with respect to the Q− signal; and a duty control module configured to:
 generate the truncated I+ signal based on the I+ signal, the Q+ signal, and a complement of the truncated Q− signal;
 generate the truncated I− signal based on the I− signal, the Q− signal, and a complement of the truncated Q+ signal;
 generate the truncated Q+ signal based on the I− signal, the Q+ signal, and a complement of the truncated I+ signal; and
 generate the truncated Q− signal based on the I+ signal, the Q− signal, and a complement of the truncated I− signal.

9. The circuit of claim 8, wherein the duty control module further comprises:
 a first logic gate configured to perform a logic operation with respect to the I+ signal, the Q+ signal, and the complement of the truncated Q− signal to generate the truncated I+ signal;
 a second logic gate configured to perform the logic operation with respect to the I− signal, the Q− signal, and the complement of the truncated Q+ signal to generate the truncated I− signal;
 a third logic gate configured to perform the logic operation with respect to the I− signal, the Q+ signal, and the complement of the truncated I+ signal to generate the truncated Q+ signal; and
 a fourth logic gate configured to perform the logic operation with respect to the I+ signal, the Q− signal, and the complement of the truncated I− signal to generate the truncated Q− signal.

10. The circuit of claim 9, wherein the logic operation includes an AND operation or an OR operation.

11. The circuit of claim 9, wherein the first logic gate is configured to output the complement of the truncated I+ signal, the second logic gate is configured to output the complement of the truncated I− signal, the third logic gate is configured to output the complement of the truncated Q+ signal, and the fourth logic gate is configured to output the complement of the truncated Q− signal, the circuit further comprising:
 a first inverter configured to generate the truncated I+ signal based on the complement of the truncated I+ signal output by the first logic gate;
 a second inverter configured to generate the truncated I− signal based on the complement of the truncated I− signal output by the second logic gate;
 a third inverter configured to generate the truncated Q+ signal based on the complement of the truncated Q+ signal output by the third logic gate; and
 a fourth inverter configured to generate the truncated Q− signal based on the complement of the truncated Q− signal output by the fourth logic gate.

12. The circuit of claim 8, wherein one or more of the truncated I+ signal, the truncated I− signal, the truncated Q+ signal, and the truncated Q− signal has a duty cycle of 25% or less.

13. The circuit of claim 8, further comprising a divider module configured to generate the I+ signal, the I− signal, the Q+ signal, and the Q− signal based on a clock signal generated by a voltage controlled oscillator ("VCO").

14. The circuit of claim 13, wherein the VCO is configured to generate the clock signal at a frequency that is associated with demodulating a wireless communication signal.

15. A method of reducing a duty cycle of one or more signals, the method comprising:
 receiving a positive in-phase ("I")-channel signal ("I+ signal"), a negative I-channel signal ("I− signal"), a positive quadrature-phase ("Q")-channel signal ("Q+ signal"), and a negative Q-channel signal ("Q− signal");
 outputting a positive truncated I-channel signal ("truncated I+ signal"), a negative truncated I-channel signal ("truncated I− signal"), a positive truncated Q-channel signal ("truncated Q+ signal"), and a negative truncated Q-channel signal ("truncated Q− signal"), the truncated I+ signal having a reduced duty cycle with respect to the I+ signal, the truncated I− signal having a reduced duty cycle with respect to the I− signal, the truncated Q+ signal having a reduced duty cycle with respect to the Q+ signal, and the truncated Q− signal having a reduced duty cycle with respect to the Q− signal;
 generating the truncated I+ signal based on the I+ signal, the Q+ signal, and a complement of the truncated Q− signal;
 generating the truncated I− signal based on the I− signal, the Q− signal, and a complement of the truncated Q+ signal;
 generating the truncated Q+ signal based on the I− signal, the Q+ signal, and a complement of the truncated I+ signal; and
 generating the truncated Q− signal based on the I+ signal, the Q− signal, and a complement of the truncated I− signal.

16. The method of claim 15, further comprising:
 performing an a logic operation with respect to the I+ signal, the Q+ signal, and the complement of the truncated Q− signal to generate the truncated I+ signal;
 performing the logic operation with respect to the I− signal, the Q− signal, and the complement of the truncated Q+ signal to generate the truncated I− signal;
 performing the logic operation with respect to the I− signal, the Q+ signal, and the complement of the truncated I+ signal to generate the truncated Q+ signal; and
 performing the logic operation with respect to the I+ signal, the Q− signal, and the complement of the truncated I− signal to generate the truncated Q− signal.

17. The method of claim 16, wherein the logic operation includes an AND operation or an OR operation.

18. The method of claim 15, wherein one or more of the truncated I+ signal, the truncated I− signal, the truncated Q+ signal, and the truncated Q− signal has a duty cycle of 25% or less.

19. The method of claim 15, further comprising generating the I+ signal, the I− signal, the Q+ signal, and the Q− signal based on a clock signal.

20. The method of claim 19, further comprising generating the clock signal at a frequency that is associated with demodulating a wireless communication signal.

* * * * *